United States Patent
Eggert et al.

(10) Patent No.: US 6,511,717 B2
(45) Date of Patent: Jan. 28, 2003

(54) METHOD FOR COATING SUBSTRATES WITH IMPROVED SUBSTRATE PREHEATING

(75) Inventors: Hartmut Eggert, Ober-Olm (DE); Armin Kunkel, Ruemmelsheim (DE); Juergen Vogt, Oberheimbach (DE); Rolf Meyer, Bad Gandersheim (DE); Peter Woerner, Mainz (DE)

(73) Assignee: Schott Glas, Mainz (DE)

( * ) Notice: Subject to any disclaimer, the term of this patent is extended or adjusted under 35 U.S.C. 154(b) by 0 days.

(21) Appl. No.: 10/139,298

(22) Filed: May 3, 2002

(65) Prior Publication Data

US 2002/0176942 A1 Nov. 28, 2002

(30) Foreign Application Priority Data

May 25, 2001 (DE) .......................................... 101 25 675

(51) Int. Cl.⁷ ................................................. H05H 1/20

(52) U.S. Cl. ....................................................... 427/573

(58) Field of Search .............................. 427/573, 248.1, 427/314, 585

(56) References Cited

U.S. PATENT DOCUMENTS

| | | |
|---|---|---|
| 4,350,578 A | 9/1982 | Frieser et al. |
| 4,710,428 A | 12/1987 | Tamamizu et al. |
| 5,137,610 A | 8/1992 | Shumate et al. |
| 5,951,774 A | 9/1999 | Shishiguchi et al. |
| 5,976,258 A | 11/1999 | Kleiner |

FOREIGN PATENT DOCUMENTS

EP    0 339 279 A2    11/1989

*Primary Examiner*—Bernard Pianalto
(74) *Attorney, Agent, or Firm*—Michael J. Striker

(57) ABSTRACT

In the method for coating substrates the substrates are placed in recesses in a glass-ceramic plate or plates arranged over infrared high-temperature radiators with the surfaces to be coated on the radiators. The substrates are heated from below to the process temperature required for the coating. Subsequently the substrates are removed from the heating device, introduced into a coating chamber and coated. The preheating device for the substrates has two glass-ceramic plates that are placed loosely on top of each other and infrared high-temperature radiators. Substrate receptacles are provided in the glass-ceramic plates by approximately coincident recesses of different size in the plates so that the substrates can be held in close proximately to the radiators during the preheating.

11 Claims, 1 Drawing Sheet

METHOD FOR COATING SUBSTRATES WITH IMPROVED SUBSTRATE PREHEATING

BACKGROUND OF THE INVENTION

The present invention relates to an improved device for pre eating substrates for a coating process that requires preheating of the substrates. It also relates to an improved coating method in which substrate preheating is required. The invention also relates to an external preheating of the substrates.

U.S. Pat. No. 5,976,258 discloses an apparatus for processing substrates. The apparatus contains a component for heating of the substrates to an elevated temperature. The substrate is pre-heated there and then transported or conveyed for further processing.

Substrate holders with recesses are disclosed in U.S. Pat. No. 4,350,578, U.S. Pat. No. 5,137,610 and JP-A-01-255671.

In the conventional method for preheating substrates, especially glass parts, prior to coating them, the preheating is energy-intensive and time-consuming.

SUMMARY OF THE INVENTION

It is an object of the present invention to provide an improved coating process in which preheating of the substrates to be coated is required.

It is another object of the present invention to provide an improved economic, environmentally friendly method for preheating substrates to be coated in a coating process.

It is a further object of the present invention to provide a heating device for preheating substrates for a coating process requiring preheating of the substrates.

The method according to the invention of coating a substrate in which preheating of the substrate is required comprises the steps of:

a) providing a device for heating the substrate, which includes at least one heat-producing component and at least one glass-ceramic plate, wherein the at least one glass-ceramic plate is provided with at least one recess and the substrate fits in the at least one recess so as to be on said at least one heat-producing component;

b) placing the substrate in the at least one recess so that a surface of the substrate to be coated is placed on the at least one heat-producing component;

c) heating the substrate from below to a process temperate required for the coating with the at least one heat-producing component; and d) removing the substrate from the device for the heating and then placing the substrate in a coating chamber; and subsequently e) coating the substrate in the coating chamber.

The heating device according to the invention for preheating the substrates considerably shortens the time required for coating the substrate. The overall process including coating and preheating saves energy. The preheating reduces wear of the coating device. The preheating of the substrate is more uniform when the preheating device according to the invention is used. The quality of the coating is improved in the coating process according to the invention. The temperature adjustment required can be implemented without influencing the process time. The coating process according to the invention facilitates stable process management.

In a preferred embodiment of the invention the heating device includes at least one heat-producing component and at least one glass-ceramic plate. The at least one glass-ceramic plate is provided with at least one recess in which the substrate fits or which matches the substrate. Because of its low thermal conductivity, the glass-ceramic material is preferred for the plate or plates.

A preferred embodiment of the heating device according to the invention has two glass-ceramic plates, which are laid loosely on top of one another and have correspondingly different recesses with different sized openings arranged approximately over each other. The approximately coincident recesses in the respective plates provide substrate receptacles. When the heating device comprises the two glass-ceramic plates, heat losses are correspondingly reduced. The production of the substrate receptacles is made easier.

In a preferred embodiment of the coating method according to the invention during the preheating of the substrates the internal temperature of the heating device is from 500° C. to 800° C. Good results are achieved within this temperature range. According to another preferred embodiment of the method at least one coating layer is provided on the substrate to be coated by the coating method.

According to various embodiments of the coating method of the invention, the coating of the substrates is performed by at least one of the following processes: CVD (chemical vapor deposition), PVD (physical vapor deposition), PECVD (plasma-enhanced chemical vapor deposition), PICVD (plasma impulse chemical vapor deposition), LPCVD (low-pressure chemical vapor deposition) or TCVD (thermal chemical vapor deposition).

In a preferred embodiment of the device according to the invention the heat-producing components are infrared high-temperature radiators. These high-temperature radiators have a longer service life.

Glass substrates are especially preferred as the substrates.

BRIEF DESCRIPTION OF THE SEVERAL VIEWS OF THE DRAWING

The objects, features and advantages of the invention will now be described in more detail with the aid of the following description of the preferred embodiments, with reference to the accompanying figures in which.

DETAILED DESCRIPTION OF THE INVENTION

Figure 1:
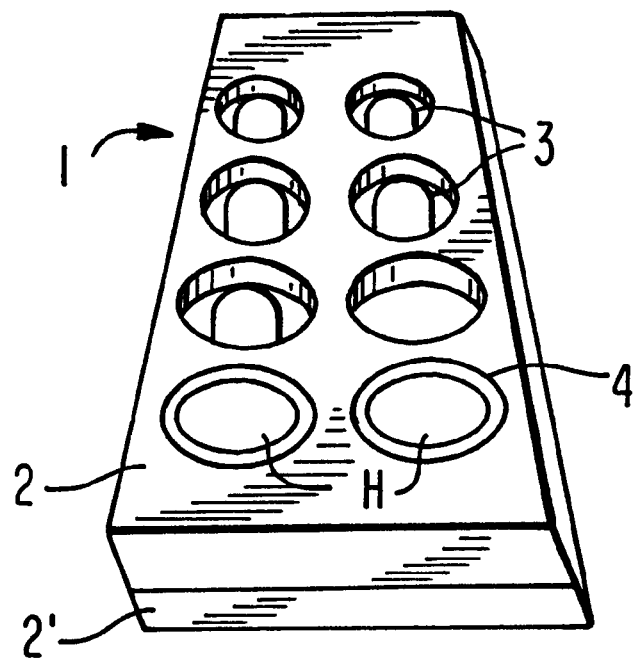
FIG. 1 is a perspective view of the device for preheating substrates for a coating process according to the invention including two glass-ceramic plates.

The heating device 1, which is shown in FIG. 1, for preheating the glass substrates includes heat-producing components 3 and two glass-ceramic plates 2,2' with recesses 4,4' for the substrates. The heat-producing components 3 are advantageously infrared high-temperature radiators, which are operated to produce an interior temperature of 500° C. in the heating device. The upstream heating resulted in 5300 parts per hour being coated.

In contrast, in a conventional method, in which the substrates were heated in a coating installation, it was possible to coat 3200 pieces per hour in a comparative example corresponding to the example of the above paragraph. A comparison between the example of the invention and the comparative example demonstrates that, using the coating process according to the invention, the yield of coated substrates has risen by 65%. The energy consumption for heating was 50% lower.

The figures show an inventive heating device for heating substrates for a coating process.

Figure 2:
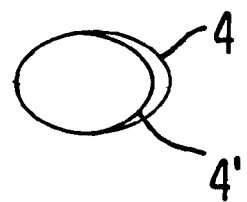
FIG. 2 is a perspective view showing a substrate receptacle comprising different sized recesses in the two glass-ceramic plates of the device of FIG. 1.

The heating device 1 for preheating the glass substrates, which is shown in FIG. 1, comprises two glass-ceramic plates 2,2', which are laid loosely over each other, and which cover the heating-producing components 3. The glass-ceramic plates 2,2' are provided with recesses 4,4', which are matched to or fit the substrates, which have different sized openings as shown in FIG. 2. The recesses 4,4' advantageously provide a substrate receptacle H. The recesses 4,4' have different sized openings 4,4'. The heat-producing components 3 arranged in the inner region of the heating device 1 are infrared high-temperature radiators.

The disclosure in German Patent Application 101 25 675.2 of May 25, 2001 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a method for coating a substrate with improved substrate preheating and improved substrate preheating device, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

We claim:

1. A method of coating a substrate in which preheating of the substrate is required, said method comprising the steps of:
    a) providing a device for heating said substrate, said device comprising at least one, heat-producing component and at least one glass-ceramic plate, herein said at least one glass-ceramic plate is provided with at least one recess and said substrate fits in said at least one recess so as to be on said at least one heat-producing component;
    b) placing said substrate in said at least one recess so that a surface of said substrate to be coated is arranged on said at least one heat-producing component;
    c) heating said substrate from below to a process temperature required for the coating with said at least one heat-producing component; and
    d) removing said substrate from the device for the heating and then placing said substrate in a coating chamber; and subsequently
    e) coating the substrate in the coating chamber.

2. The method as defined in claim 1, wherein the device for the heating includes a substrate receptacle for holding the substrate comprising said at least one recess provided in the at least one glass-ceramic plate.

3. The method as defined in claim 1, wherein the device for the heating has an interior temperature of 500° C. to 800° C. during the heating of the substrate.

4. The method as defined in claim 1, wherein said substrate is provided with at least one coating layer during said coating.

5. The method as defined in claim 1, wherein said coating takes place by means of at least one of a chemical vapor deposition process, a physical vapor deposition process, a plasma-enhanced chemical vapor deposition, a plasma impulse chemical vapor deposition, a low-pressure chemical vapor deposition and a thermal chemical vapor deposition process.

6. The method as defined in claim 1, wherein said substrate is made of glass.

7. A method of coating substrates in which preheating of the substrates is required, said method comprising the steps of:
    a) providing a device for heating said substrates, said device comprising a plurality of heat-producing components and at least two glass-ceramic plates placed loosely on top of each other, wherein said glass-ceramic plates are provided with a plurality of recesses for said substrates and said substrates fit in or match said recesses so as to be on said heat-producing components;
    b) placing said substrates in said recesses so that surfaces of said substrates to be coated are arranged on said heat-producing components;
    c) heating said substrates from below to a process temperature required for the coating with said heat-producing components; and
    d) removing said substrates from the device for the heating and then placing said substrates in a coating chamber; and subsequently
    e) coating the substrates in the coating chamber.

8. The method as defined in claim 7, wherein the device for the heating of the substrates has an interior temperature of 500° C. to 800° C. during the heating of the substrates.

9. The method as defined in claim 7, wherein said substrate is provided with at least one coating layer during said coating.

10. The method as defined in claim 7, wherein said coating takes place by at least one of a chemical vapor deposition process, a physical vapor deposition process, a plasma-enhanced chemical vapor deposition, a plasma impulse chemical vapor deposition, a low-pressure chemical vapor deposition and a thermal chemical vapor deposition process.

11. The method as defined in claim 7, wherein said substrate is made of glass.

* * * * *